United States Patent [19]

Yen

[11] Patent Number: 5,003,062

[45] Date of Patent: Mar. 26, 1991

[54] SEMICONDUCTOR PLANARIZATION PROCESS FOR SUBMICRON DEVICES

[75] Inventor: Daniel L. Yen, Chu-Tung, Taiwan

[73] Assignee: Taiwan Semiconductor Manufacturing Co., Hsincho, Taiwan

[21] Appl. No.: 512,401

[22] Filed: Apr. 19, 1990

[51] Int. Cl.⁵ .......................................... H01L 21/469
[52] U.S. Cl. .................................... 437/231; 437/235; 437/238; 437/228; 148/DIG. 43
[58] Field of Search .............. 437/228, 231, 235, 238; 148/DIG. 43

[56]   References Cited
U.S. PATENT DOCUMENTS

| 4,719,125 | 1/1988 | Anello et al. | 437/231 |
| 4,721,548 | 1/1988 | Morimoto | 437/228 |
| 4,885,262 | 12/1989 | Ting et al. | 437/231 |
| 4,935,095 | 7/1990 | Lehrer | 437/228 |

OTHER PUBLICATIONS

Chiang et al., "Defects Study on Spin on Glass Planarization Technology", V-MIC Conference, 6/87, pp. 404–412.
Schiltz, "Advantages of Using Spin-On-Glass Layer in Interconnection Dielectric Planarization", Microelectronic Engineering 5(1986); pp. 413–421.
Gupta et al., "Interlevel Dielectric Planarization with Spin-On-Glass Films"; V-MIC Conference; Jun. 1986; pp. 506–515.
Yen et al.; "Process Integration with Spin-On-Glass Sandwich as an Intermetal Dielectric Layer for 1.2 Micrometer CMOS DLM Process"; V-MIC Conference; Jun. 13–14, 1988; pp. 85–94.
Forester et al.; "SOG Planarization for Polysilicon and First Metal Interconnect in a One Micron CMOS Process"; V-MIC Confer.; 6/88; pp. 72–79.
Nishida et al.; "Multilevel Interconnection for Half-Micron ULSI's"; V-MIC Conference; 6/1988; pp. 19–25.

Primary Examiner—Brian E. Hearn
Assistant Examiner—Trung Dang
Attorney, Agent, or Firm—George O. Saile

[57]    ABSTRACT

A method is described for planarization of dielectric layers between conductor layers in multilayer metallurgy of submicron integrated circuit devices. The method begins with the integrated circuit intermediate product having devices, such as FETs or bipolar formed therein, but before interconnection metallurgy has been formed on the principal surface of the product. The principal surface has a patterned conductive layer at its surface. The spin-on-glass sandwich now is begun to be formed by depositing a silicon dioxide coating over the patterned conductor layer. A first layer of spin-on-glass is deposited upon the silicon dioxide coating. The layer is baked at a temperature of less than about 350 degrees C. Vacuum degassing of the coating at less than about 100 mtorr and 350 degrees C. effectively overcomes the outgassing problem by removing unwanted gases in the glass layer at this point in the process. The spin-on-glass layer process just given is repeated for subsequent layers of spin-on-glass until the desired thickness of planarized spin-on-glass dielectric layer has been formed. The layers are then cured at a temperature of less than about 500 degrees C. The second layer of silicon dioxide coating over the spin-on-glass dielectric layer completes the planarization. A vacuum degassing step is performed just before the deposition of the next conductor layer.

19 Claims, 1 Drawing Sheet

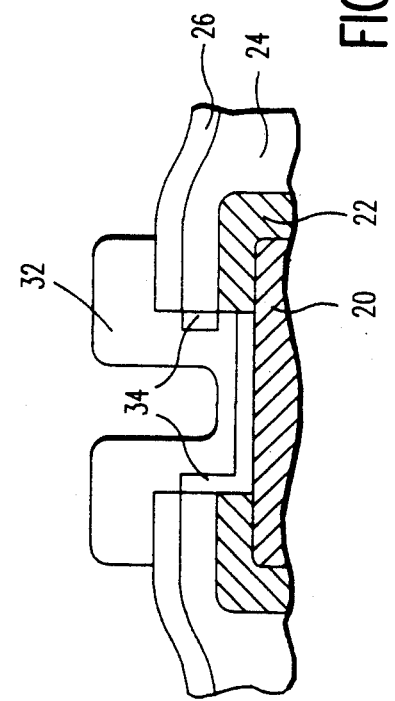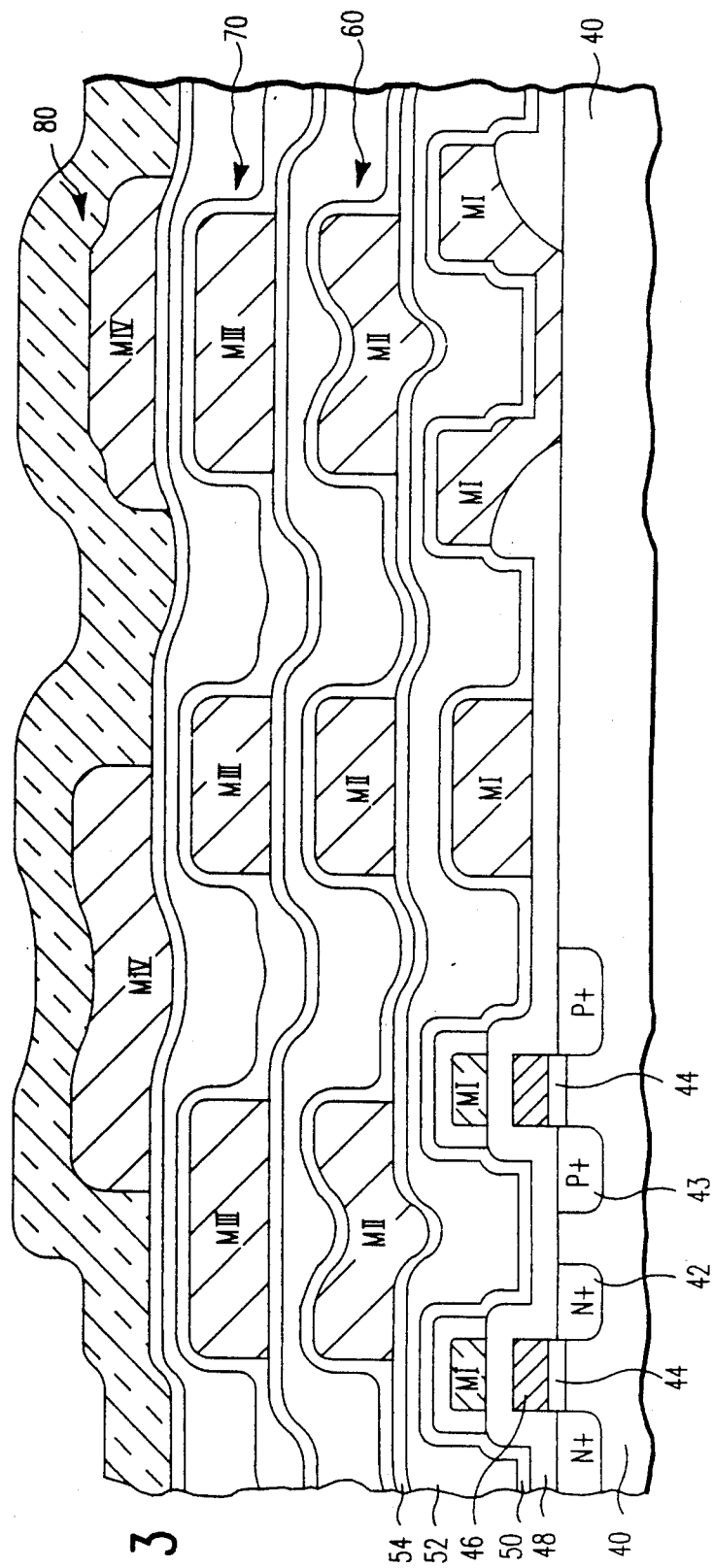

SEMICONDUCTOR PLANARIZATION PROCESS FOR SUBMICRON DEVICES

TECHNICAL FIELD

The invention relates to planarization of the dielectric layers within the multilayer metallurgy which separate the conductor layers. The planarization involves the nonetchback spin-on-glass techniques.

DESCRIPTION OF THE PRIOR ART

The growing and regrowing of insulating films such as silicon dioxide and the use of polysilicon and/or metals in the form of conductors, ohmic contacts, resistors and the like in the manufacture of integrated circuits cause irregular or substantially non-planar surfaces across the surface of the semiconductor substrate. A major problem that is caused by these irregular or non-planar surfaces is loss of resolution in the lithographic masking processed. For example, metal conductors formed on the insulating films have different widths across the surface of the semiconductor body due to the different resist development because of the resolution problems. To prevent conductors from having varying widths to the point where they might cause short circuits, extra spacing or tolerances are required with each conductor. The increased tolerances reduce the number of devices that may be formed in the semiconductor structure. This problem increases with each higher level of metallurgy and with the use of submicron lithography features. In these highly dense, submicron integrated circuits 3 or 4 levels of interconnection metallurgy is required.

These problems have been recognized in the prior art and attempts have been made to overcome these topographical problems principally in the one micron and above feature dimensions. These techniques can be generally grouped in categories of planarization either involving etchback or nonetchback techniques.

In the case of etchback processing, typically a coating is formed on top of the irregular surfaces by an means of spin-on-glass or thermoplastic deposition techniques which produces a planar surface. A plasma, reactive or chemical wet etching is used uniformally across the planar surface to remove the deposited layer and the tops of the irregular humps or the like to produce a planar surface at the desired depth. An example of such a process is shown in the S. Morimoto U.S. Pat. No. 4,721,548.

In the early nonetchback processing, the usual technique was to heat the dielectric layer, which was typically glass until the flow of the glass reduced the irregularities as shown by U.S. Pat. No. 3,825,442.

More recently the nonetchback planarization using a spin-on-glass sandwich has found interest at the about one micron feature dimension integrated circuit processing. This technique is described in "Process Integration with Spin-On-Glass Sandwich as an Intermetal Dielectric Layer for 1.2 Micron CMOS DLM Process" by Daniel L. W. Yen et al and given at the V-Mic Conference June 13-14, 1988 CH-2624-5/88/0000-0085 1988 IEEE. In this paper a sandwich dielectric structure is formed and used in the 1.2 micron process consisting of 0.15 micrometers of spin-on-glass sandwiched between two plasma silicon dioxide layers of 0.3 micrometers each. The spin-on-glass layer functions as the means for planarizing the irregularities. A single spin-on-glass layer does not produce as good a planarity as the use of two layers, so two spin-on-glass layers are used. After the deposition of each layer, there is a baking step. After the deposition of both layers and their baking steps, there is the longer curing or stabilization step of 20 minutes at 250 degrees C.

Another paper, "SOG Planarization for Polysilicon and First Metal Interconnect" by L. Forester et al given at the June 12-13, 1989 VMIC Conference TH-0259-2/89/0000-0072 1989 IEEE describes a varition of the above paper for a one micron CMOS process. The same spin-on-glass sandwich is used, but the processing has been slightly changed. After the silicon dioxide film is deposited, two spin-on-glass layers where formed using double spining after each layer was deposited. Baking was for 1½ minutes at 70 to 200 degrees C. Two cures were used after the completion of the spin-on-glass process, one at 425 degrees C. for 35 minutes and one at 800 degrees C. for 30 minutes.

Another paper, "Multilevel Interconnection for Half-Micron ULSI'S" by T. Nishida et al given at the June 12-13, 1989 VMIC Conference TH-0259-2/89/0000-0019 IEEE addresses the real problem of submicron processing using nonetchback spin-on-glass processing for planarization. This process uses a phosphosilicate glass/spin-on-glass/phosphosilicate glass sandwich. Three layers of spin-on-glass are used and after each layer is deposited an anneal is performed at 600 degrees C. for 30 minutes. The alternate dielectric is a double sandwich of P-SiO/SOG/P-SiO/SOG/P-SiO. There are two layers of spin-on-glass within the SOG and after each coating there is an anneal at 450 degrees C. for 30 minutes.

SUMMARY OF THE INVENTION

There are many manufacturing advantages to the use of a nonetchback spin-on-glass as the dielectric interlayer for multilayer metallurgy structure useful in the highly dense, submicron integrated circuit devices. The serious problems of outgassing from the spin-on-glass during the deposition of the next condutor layer and the cracking of the spin-on-glass have become the major problems to the scaling down of the spin-on-glass planarization techniques to below the one micron or submicron. The complete curing of the thick, multilayer spin-on-glass layer is extremely difficult, since multiple coatings are necessary to planarize before the next conductor deposition. This problem causes outgassing during the conductor deposition and interface corrosion of the depositing conductor particularly when the conductor is a metal.

It is the object of this invention to overcome these problems of scaling down the spin-on-glass sandwich planarization process to submicron processing.

In accordance with the present invention, a method is described for planarization of dielectric layers between conductor layers in multilayer metallurgy of submicron integrated circuit devices. The method begins with the integrated circuit intermediate product having devices, such as FETs or bipolar formed therein, but before interconnection metallurgy has been formed on the principal surface of the product. The principal surface has a patterned conductive layer at its surface. The spin-on-glass sandwich now is begun to be formed by depositing a silicon dioxide coating over the patterned conductor layer. A first layer of spin-on-glass having a thickness of less that about 0.3 micrometers is deposited upon the silicon dioxide coating where a silicate spinon-glass is used. If a siloxane type spin-on-glass is used a first layer may be as thick as about 1 micrometer. The layer is baked at a temperature of less than about 350 degrees C. Vacuum degassing of the coating at less than about 100 mtorr and 350 degrees C. effectively overcomes the outgasing problem by removing unwanted gases in the glass layer at this point in the process rather than waiting for the subsequent curing step. The spin-on-glass layer process just given is repeated for subsequent layers of spin-on-glass until the desired thickness of planarized spin-on-glass dielectric layer has been formed. The total thickness of spin-on-glass glass should be less than about 2 micrometers. The layers are then cured at a temperature of less than about 500 degrees C. The second layer of silicon dioxide coating over the spin-on-glass dielectric layer completes the planarization. A vacuum degassing step is performed just before the deposition of the next conductor layer.

BRIEF DESCRIPTION OF THE DRAWINGS

FIGS. 1 and 2 are vertical cross-sectional drawings that illustrate problems involved in using prior art methods in submicron spin-on-glass planarization.

FIG. 3 is a vertical cross-sectional drawing that shows the result of spin-on-glass processing by the procedures of the present invention.

DESCRIPTION OF THE PREFERRED EMBODIMENTS

The sandwich structure used in this invention as a nonetchback planarization technique includes three layers, that is a silicon dioxide or the like coating on the surface to be planarized, a spin-on-glass layer thereover which actually is formed by depositing two or more spin-on-glass coats and a silicon dioxide or the like coating thereover. Each of these layers has a specific purpose.

The first silicon dioxide or the like layer serves as an adhesion and a hillock suppression layer between the pattered conductor, such as a metal layer that it is deposited upon and the spin-on-glass layer that will be deposited thereover. It also, of course prevents the spin-on-glass material from being in contact with the patterned conductor.

The second layer of the sandwich is the spin-on-glass composite of spin-on-glass coatings. Its function is to serve as the planarization layer of the sandwich. It is necessary to use two or more coating of spin-on-glass to provide the best possible planarization. After the curing of this layer, the resulting layer is similar to silicon dioxide. This layer may be doped with N or P type dopants to relieve stress.

The final silicon dioxide or the like layer serves as an isolation layer. It isolates the spin-on-glass layer from the next conductive layer level.

The spin-on-glass materials and how they are processed are critical to the success of the process. The most useful materials are silicates—Si(OH)4 and siloxanes—(RO)nSi(OH)4−n. The material to be applied is thoroughly mixed in a suitable solvent which is usually a combination of a high boiling point solvent and a low boiling point solvent.

The prefered low boiling point solvents are methanol, ethanol, and propanol. The middle boiling point solvents are buthanol, penthanol, hexanol and methyl celloslve. The high boiling point solvents are butylcelloslve, propylenglycol, diethyleneglycol and Carbindol. Other potential vehicles or solvents are NMP, HMPA, N.N-dimethylacetoamide, acetyl acetone, and malonic acid diethylester and the like.

The spin-on-glass material suspended in the vehicle or solvent is deposited onto the semiconductor wafer surface and uniformly spread thereover by the action of spinning the wafer. Most of the vehicle or solvent is driven off by a low temperature baking step. At this point, the critical vacuum degassing step is accomplished by subjecting the wafer to a vacuum of less than about 100 mtorr and 350 degrees C. This last step removes chemical materials which could during latter processing cause cracking and corrosion of the next level conductor material. Other coatings of the spin-on-glass material are applied, baked and vacuum degassed until the desired spin-on-glass layer is formed.

The final step in the making of the spin-on-glass layer is curing. Curing is a high temperature heating step to cause the breakdown of the silicate or siloxane material to a silicon dioxide like cross linked material. Water in the form of steam is the major reaction product of this reaction. The silicate spin-on-glass is cured at about 390 degrees C. and siloxane spin-on-glass is cured at about 450 degrees C. in Nitrogen.

Referring now more particularly to FIG. 1, there is shown a planarized multilayer metallurgy structure that has failed, because of cracking. There is shown a semiconductor substrate 10 having N type diffused regions 12 therein. Polysilcon gate structures composed of the gate dielectric 14 and gate electrode or conductor 16 are formed on the surface of the substrate 10 and cooperate with the diffused regions to act as MOSFET devices. An insulating or dielectric layer 18 is formed thereover by conventional means. A conductor layer 20 has been deposited, patterned by lithography and etching. The spin-on-glass sandwich layer composed of silicon dioxide like layer 22, spin-on-glass layer 24 and silicon dioxide like layer 26. A crack area 30 is shown in the spin-on-glass layer 24 that is caused when prior art planarization processes are used in submicron processes. This cracking occurs during curing at temperatures above about 400 degrees C. and where the spin-on-glass layer is more than about 0.6 micrometers in thickness.

Referring now more particularly to FIG. 2, there is shown a planaried multilevel metallurgy structure that has failed because of corrosion caused by outgassing during the next level of metallurgy deposition such as by sputtering. This drawing is an extention of FIG. 1 in that it shows the same structures having like numbers, that is conductor or metal layer 20, and spin-on-glass sandwich 22, 24 and 26. A via etching step has been used to open at least one of the patterned metal layer 20 through the spin-on-glass sandwich. The next level of the multilevel metallurgy has been deposited, such as by sputtering. During this deposition process, severe outgassing has occured which contaminated the layer between metal layer 20 and metal layer 32 at regions 34 which occur when prior art processes are used in submicron planarization. Such a contaminated region 34 will cause device failure. The slope coverage of the metal layer 32 is deteriated by the corrosion due to outgassing and will cause reliability problems.

Referring now to FIG. 3, the illustrated submicron, 4 level of metallurgy integrated circuit semiconductor device can be produced by the method of the present invention without the prior art failure problems described in relation to the FIGS. 1 and 2. Conventional semiconductor processes for the manufacture of submicron integrated circuit devices are used to form within the semiconductor substrate 40 which is typically (100) oriented silicon, but could be another semiconductor material such as gallium arsenide. The processes can be used to form, for example MOSFET devices which may be N channel, P channel or CMOS, or bipolar devices or a combination of such devices, BICMOS, etc. In FIG. 3, there is schematically illustrated a CMOS FET device with N+ type diffusions 42 making up the N channel device and P+ type diffusions 43 making up the P channel device in the substrate 40 and polysilicon gate dielectric layer 44 and gate electrode or conductor 46 for each of these devices making up the CMOS FET structure. The gate electrode 46 may be typically polysilicon as indicated as. An insulator layer 48 is deposited thereover by conventional means, such as chemical vapor deposition of silicon dioxide.

The fabrication of the multilevel metallurgy structure begins by opening vias to the polysilicon gate electrodes 46 and substrate 40 where appropriate. FIG. 3 only illustrates an opening to the substrate in its cross-sectional view, but obviously connections are made to the gates 46. Often in the fabrication of integrated circuit devices, it is desirable and even necessary to have two or even three layers of polycrystalline silicon before the deposition of the first Metal layer M I. There is, however only shown in the FIG. 3 one layer of polysilicon Poly I, 46 for the sake of simplicity. There may of course be and usually are second layer Poly II and the third layer Poly III. There are, of course, layers of dielectric insulation layers formed between these layers after the patterning of each polysilicon layer. The resulting principal surface of the device is very nonplanar and requires a substantial planarization process. The spin-on-glass SOG sandwich may be formed over the polysilicon layer before the deposition of Metal I layer M I. However, the principal planarization is usually begun after the deposition of MI as will be hereinafter described. A conductor is blanket deposited over the principal surface of the structure. Lithography and etching conventional techniques are now used to pattern the first level of metallurgy as shown as M I in the drawing.

The planarization at the M I level according to the present invention now begins with the deposition of a silicon dioxide layer 50 by plasma oxide or chemical vapor deposition. The deposition should be thick enough to fully cover the M I layers so that there will be no conductor contact with the subsequent spin-on-glass layer. The thickness should be more than about 0.1 micrometers and less than about 1 micrometer.

Now the spin-on-glass layer 52 is formed. This layer has the function of performing the actual planarization. The layer is formed by the deposition of two to four coating step series. Each of these coating steps include the coating deposition step of a silicate or siloxane type spin-on-glass material in a vehicle by spinning the wafer to which it has been applied. These types of materials are generally known and available. Examples of the silicate type is OCD Type 2 made by Tokyo Okha Corp. and siloxane type is OCD Type 6 made by Tokyo Okha Corp. Each spin-on-glass coating is less than about 0.3 micrometers and preferably between about 0.08 and 0.2 micrometers for the silicate type of material and less than about 1.0 micrometer for the siloxane type of material. Note that the coating or layer thickness means the surface thickness and not the valley thickness which is much greater, since the valleys are preferentially filled during the spin-on-glass process. The siloxane coatings can use fewer coatings than silicate coatings to reach the maximum surface coating of about 2 micrometers. However, the more coatings that are used, the better the planarity. After each coating, the wafer is baked at a temperature of less than about 350 degrees C. for about 1 to 2 minutes to drive off the solvent or vehicle from the coating. The prefered baking temperature is between about 250 and 300 degrees C. which can be accomplished by heating the wafer on a hot plate. Temperatures higher than 350 degrees C. causes cracking of the glass. Temperatures lower than about 200 degree C. are insufficient for adequate degassing and will not overcome the FIG. 2 problem of metal or polysilicon contamination. The third step in the sequence for each coating is vacuum degassing. This step is done by placing the wafer in a vacuum of less than about 100 mtorr and 350 degrees C. for at least about 20 minutes. Preferably the vacuum is less than 10 mtorr, between about 200 and 350 degrees C. and for more than about 20 minutes. Should the vacuum be higher than about 100 mtorr the vacuum degassing would be insufficient. The vacuum degassing removes all residual solvents and other chemicals that could in later processing cause cracking and corrosion of metal or polysilicon layers.

The three coating steps, that is spin-on-glass deposition, baking and vacuum degassing for each of two to four coatings are repeated until the desired thickness of layer 52 is obtained. The spin-on-glass coating 52 can reach a thickness of more than 1.3 micrometers without subsequent cracking during submicron processing. The maximum thickness preferred is less than about 2 micrometers.

After the completion of the deposition of layer 52 deposition, curing of the layer 52 is accomplished by heating at between about 390 and 500 degrees C. in nitrogen for more than about 35 minutes to crosslink and stabilize the silicate or siloxane layer. Higher curing temperatures than 500 Degrees C. are useful if the metal layer is uneffected by the temperature. For example where aluminum or one of its alloys is used the curing temperature should be 500 Degree C. or lower.

The final silicon dioxide or the like layer 54 of the sandwich is deposited by conventional chemical vapor deposition or similar process. The thickness of this layer must be great enough to completely isolate the spin-on-glass layer from the subsequently deposite conductor or metal layer M II. Preferably the thickness is between about 0.1 and 1 micrometer.

Via etching is done using conventional lithography and etching techniques to make appropriate openings through the spin-on-glass sandwich 50, 52, 54 to the M I regions. This etching may be done, for example in a AME 8311 oxide etcher using CF4 and CHF3 etching gases.

Just before the deposition of the next level of metallization M II and after the via opening has been done, vacuum degassing is done at the less than about 100 mtorr and about 350 degree C. for more than 20 minutes and preferably less than about 10 mtorr and between about 200 and 350 degrees C. for more than about 20 minutes. This step avoids the prior art processing corrosion problem shown in FIG. 2 and described above.

The metal, such as aluminum layer M II may now be deposited such as by sputtering, chemical vapor deposition or evaporation and then suitably patterned using conventional lithography and etching techniques.

The same processing as was described above is used for planarizing, via etching and metal deposition to complete the four level multilevel metallurgy structure shown in FIG. 3 wherein the subsequent metal layers are M III and M IV, and the spin-on-glass sandwichs are 60 and 70. A conventional passivation layer 80 is then formed over the M IV to complete the integrated circuit device. The layer 80 could even be a spin-on-glass sandwich as descreded above, but this is not necessary.

While the invention has been particularly shown and described with reference to the preferred embodiments thereof, it will be understood by those skilled in the art that various changes in form and details may be made without departing from the spirit and scope of the invention. For example, while the detailed example of the integrated circuit used a MOSFET integrated circuit, it is obvious to those skilled in the are that the planarization techniques of the invention will also be applicable to bipolar, BICMOS and other types of integrated circuit devices useful in the submicrom processing field. Also, the incorporation of more than one polysilicon layer before the use of the metal layer M I is clearly useful. In this alternative, a spin-on-glass layer is useful for planarization before the M I layer is formed.

What is claimed is:

1. Method for planarization of dielectric layers between conductor layers in multilayer metallurgy of submicron IC devices comprising:
   providing a semiconductor substrate having FET devices formed within and on its surface and with at least one patterned conductive layer thereover;
   depositing a silicon dioxide coating over said patterned conductor layer;
   covering the said silicon dioxide coating with a spin-on-glass layer having a thickness of less than about 1.0 micrometers, baking the said coating at a temperature less than about 350 degree C., vacuum degassing the said coating at less than about 100 mtorr and 350 degrees C.;
   repeating said covering with spin-on-glass, baking and vacuum degassing processes at least one more time until the desired thickness of planarized spin-on-glass dielectric layer is formed;
   curing the said spin-on-glass dielectric layer; and depositing a silicon dioxide coating over said spin-on-glass dielectric layer to complete said planarization.

2. The method of claim 1 and further comprising vacuum degassing the resulting said spin-on-glass dielectric layer at less than about 100 mtorr and 350 degrees C. before depositing a second conductor layer to avoid interface contamination.

3. The method of claim 2 wherein the said vacuum degassing was performed at less than about 10 mtorr and between about 200 to 350 degrees C.

4. The method of claim 1 wherein the said FET devices have a polysilicon gate and the conductor layer is metal.

5. The method of claim 3 wherein the said spin-on-glass coating is the silicate type, the thickness of each spin-on-glass layer is between about 0.08 and 0.2 micrometers, and the baking temperature is between about 250 to 300 degrees C. for less about 3 minutes.

6. The method of claim 3 wherein the said spin-on-glass coating is a siloxane type, the thickness of each spin-on-glass layer is between about 0.08 and 0.2 micrometers, and the baking temperature is between about 250 and 300 degrees C. for less than about 3 minutes.

7. Method for planarization of dielectric layers between conductor layers in multilayer metallurgy of submicron IC devices comprising:
   providing a semiconductor substrate having bipolar devices formed within its surface and with at least one patterned conductive layer thereover;
   depositing a silicon dioxide coating over said patterned conductor layer;
   covering the said silicon dioxide coating with a spin-on-glass layer having a thickness of less than about 1.0 micrometers, baking the said coating at a temperature less than about 350 degree C., vacuum degassing the said coating at less than about 100 mtorr and 350 degrees C.;
   repeating said covering with spin-on-glass, baking and vacuum degassing processes at least one more time until the desired thickness of planarized spin-on-glass dielectric layer is formed;
   curing the said spin-on-glass dielectric layer; and depositing a silicon dioxide coating over said spin-on-glass dielectric layer to complete said planarization.

8. The method of claim 7 and further comprising vacuum degassing the resulting said spin-on-glass dielectric layer at less than about 100 mtorr and 350 degrees C. before depositing a second conductor layer to avoid interface contamination.

9. The method of claim 8 wherein the said vacuum degassing was performed at less than about 10 mtorr and between about 200 to 350 degrees C.

10. The method of claim 9 wherein the said spin-on-glass coating is the silicate type, the thickness of each spin-on-glass layer is between about 0.08 and 0.3 micrometers, and the baking temperature is between about 250 to 300 degrees C. for less about 3 minutes.

11. The method of claim 9 wherein the said spin-on-glass coating is a siloxane type, the thickness of each spin-on-glass layer is between about 0.08 and 1.0 micrometers, and the baking temperature is between about 250 and 300 degrees C. for less than about 3 minutes.

12. Method for fabricating a submicrom IC semiconductor device comprising: forming individual semiconductor devices within and on a semiconductor substrate; and forming a multilayer metallurgy structure over and connected to said devices to produce said IC semiconductor device; the planarization of the dielectric layers between conductive layers in said multilayer metallurgy structure is made by depositing a silicon dioxide coating over an already patterned conductor layer; covering the said silicon dioxide coating with a spin-on-glass layer having a thickness of less than about 1.0 micrometers, baking the said coating at a temperature less than about 350 degrees C., vacuum degassing the said coating at less than about 100 mtorr and 350 degrees C.; repeating said covering with spin-on-glass, baking and vacuum degassing processes at least one more time until the desired thickness of planarized spin-on-glass dielectric layer is formed; curing the said spin-on-glass dielectric layer; and depositing a silicon dioxide coating over said spin-on-glass dielectric layer to complete said planarization.

13. The method of claim 12 and further comprising vacuum degassing the resulting said spin-on-glass dielectric layer at less than about 100 mtorr and 350 degrees C. before depositing a second conductor layer to avoid interface contamination.

14. The method of claim 12 wherein the said vacuum degassing was performed at less than about 10 mtorr and between about 200 to 350 degrees C., the said spin-on-glass coating is the silicate type, the thickness of each spin-on-glass layer is between about 0.08 and 0.3 micrometers, and the baking temperature is between about 250 to 300 degrees C. for less about 3 minutes.

15. The method of claim 12 wherein the said vacuum degassing was performed at less than about 10 mtorr and between about 200 to 350 degrees C., the said spin-on-glass coating is the siloxane type, the thickness of each spin-on-glass layer is between about 0.08 and 1.0 micrometers, and the baking temperature is between about 250 and 300 degrees C. for less than about 3 minutes.

16. The method of claim 15 wherein the individual devices within and on said semiconductor substrate are polysilicon gate FET devices and the conductors are metal.

17. The method of claim 15 wherein the individual devices within and on said semiconductor substrate are bipolar devices.

18. The method of claim 12 wherein the said conductive layers are aluminum and said curing of said spin-on-glass dielectric layer is done at a temperature of less than about 500 Degrees C.

19. The method of claim 12 wherein the said desired thickness of the planarized spin-on-glass layer is less than about 2 micrometers.

* * * * *